(12) United States Patent
Kasahara et al.

(10) Patent No.: US 12,557,480 B2
(45) Date of Patent: Feb. 17, 2026

(54) DISPLAY DEVICE AND ELECTRONIC DEVICE

(71) Applicants: Sony Group Corporation, Tokyo (JP); Sony Semiconductor Solutions Corporation, Kanagawa (JP)

(72) Inventors: Naoya Kasahara, Kanagawa (JP); Takeo Tsukamoto, Kanagawa (JP)

(73) Assignees: Sony Group Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 471 days.

(21) Appl. No.: 18/036,299

(22) PCT Filed: Nov. 11, 2021

(86) PCT No.: PCT/JP2021/041563
§ 371 (c)(1),
(2) Date: May 10, 2023

(87) PCT Pub. No.: WO2022/107679
PCT Pub. Date: May 27, 2022

(65) Prior Publication Data
US 2023/0413609 A1    Dec. 21, 2023

(30) Foreign Application Priority Data
Nov. 17, 2020  (JP) .................... 2020-191270

(51) Int. Cl.
*H10K 59/122*  (2023.01)
*H10K 59/80*  (2023.01)

(52) U.S. Cl.
CPC ..... *H10K 59/122* (2023.02); *H10K 59/80518* (2023.02); *H10K 59/80524* (2023.02)

(58) Field of Classification Search
None
See application file for complete search history.

(56) References Cited

U.S. PATENT DOCUMENTS

2013/0134474 A1*  5/2013  Takeuchi .............. H10H 20/833
                                                           438/22
2014/0319475 A1* 10/2014  Joo ...................... H10K 59/122
                                                           438/34

(Continued)

FOREIGN PATENT DOCUMENTS

JP        2003187970 A    7/2003
JP        2003249376 A    9/2003

(Continued)

OTHER PUBLICATIONS

International Search Report (PCT/ISA/210), International Application No. PCT/JP2021/041563, dated Dec. 21, 2021.

*Primary Examiner* — Michelle Mandala
(74) *Attorney, Agent, or Firm* — Michael Best & Friedrich LLP

(57) ABSTRACT

Provided is a display device capable of suppressing fluctuation in light emission luminance.

A display device includes: a first electrode layer having a plurality of electrodes arranged two-dimensionally; a second electrode layer provided to face the first electrode layer; an electroluminescence layer provided between the first electrode layer and the second electrode layer; and an insulating layer provided between adjacent electrodes. The insulating layer has a plurality of openings, and each of the plurality of openings is provided corresponding to each of the electrodes. The insulating layer includes a plurality of localized portions, and each of the plurality of localized portions is localized around each of the openings. The insulating layer forms a potential barrier between the electroluminescence layer and the localized portion.

14 Claims, 13 Drawing Sheets

(56) References Cited

U.S. PATENT DOCUMENTS

| | | | |
|---|---|---|---|
| 2015/0060826 A1* | 3/2015 | Matsumoto | H10K 59/122 |
| | | | 438/34 |
| 2016/0155784 A1* | 6/2016 | Park | H10K 50/822 |
| | | | 438/23 |
| 2019/0393441 A1 | 12/2019 | Itonaga | |
| 2021/0020711 A1* | 1/2021 | Hu | H10K 71/40 |

FOREIGN PATENT DOCUMENTS

| | | |
|---|---|---|
| JP | 2015015194 A | 1/2015 |
| KR | 20140140484 A | 12/2014 |
| TW | 200735431 A | 9/2007 |
| TW | 201214693 A | 4/2012 |
| WO | 2018147048 A1 | 8/2018 |
| WO | 2018147050 A1 | 8/2018 |
| WO | 2020111202 A1 | 6/2020 |

\* cited by examiner

A

B

DISPLAY DEVICE AND ELECTRONIC DEVICE

TECHNICAL FIELD

The present disclosure relates to a display device and an electronic device including the display device.

BACKGROUND ART

In recent years, organic electroluminescence (EL) display devices (hereinafter, simply referred to as a "display device") have become widespread. As this display device, there has been proposed a display device in which a first electrode layer and a second electrode layer are arranged to face each other with an organic electroluminescence layer interposed therebetween, and the first electrode layer includes a plurality of electrodes separated by an insulating layer (see, for example, Patent Document 1).

CITATION LIST

Patent Document

Patent Document 1: WO 2018/147050 A

SUMMARY OF THE INVENTION

Problems to be Solved by the Invention

However, in the display device having the configuration described above, there is a problem that the light emission luminance fluctuates.

An object of the present disclosure is to provide a display device capable of suppressing fluctuation in light emission luminance and an electronic device including the display device.

Solutions to Problems

In order to solve the above problem, a first disclosure is a display device including:
a first electrode layer having a plurality of electrodes arranged two-dimensionally;
a second electrode layer provided to face the first electrode layer;
an electroluminescence layer provided between the first electrode layer and the second electrode layer; and
an insulating layer provided between the electrodes adjacent,
in which the insulating layer has a plurality of openings, and each of the plurality of openings is provided corresponding to each of the electrodes,
the insulating layer includes a plurality of localized portions, and each of the plurality of localized portions is localized around each of the openings, and
the insulating layer forms a potential barrier between the electroluminescence layer and a localized portion.

A second disclosure is an electronic device including the display device of the first disclosure.

MODE FOR CARRYING OUT THE INVENTION

Figure 1:
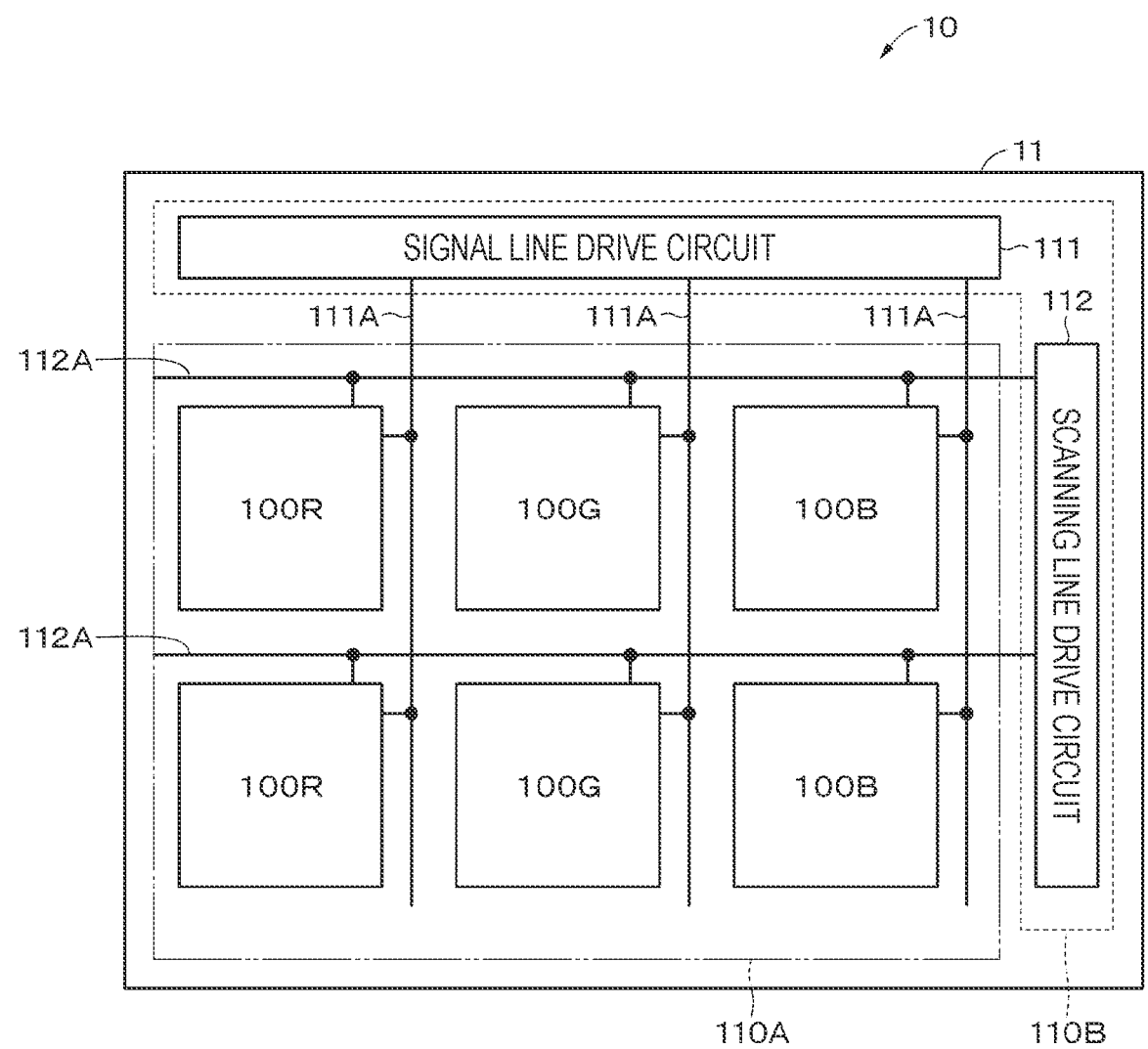
FIG. 1 is a schematic diagram illustrating an example of an overall configuration of a display device according to an embodiment of the present disclosure.

Embodiments of the present disclosure will be described in the following order with reference to the drawings. Note that, in all the drawings of the following embodiments, the same or corresponding parts are denoted by the same reference numerals.

1 Embodiment (Example of Display Device)
2 Modification (Modification of Display Device)
3 Application Example (Example of Electronic Device)

1 Embodiment

[Configuration of Display Device]

FIG. 1 is a schematic diagram illustrating an example of an overall configuration of a display device 10 according to an embodiment of the present disclosure. The display device 10 includes a display region 110A and a peripheral region 110B provided on a peripheral edge of the display region 110A. In the display region 110A, a plurality of subpixels 100R, 100G, and 100B is two-dimensionally arranged in a prescribed arrangement pattern such as a matrix shape.

The subpixels 100R display red, the subpixels 100G display green, and the subpixels 100B display blue. Note that, in the following description, the subpixels 100R, 100G, and 100B will be referred to as subpixels 100 unless otherwise distinguished. A combination of adjacent subpixels 100R, 100G, and 100B constitutes one pixel. FIG. 1 illustrates an example in which a combination of three subpixels 100R, 100G, and 100B arranged in the row direction (horizontal direction) constitutes one pixel.

In the peripheral region 110B, a signal line drive circuit 111 and a scanning line drive circuit 112, which are drivers for video display, are provided. The signal line drive circuit 111 supplies a signal voltage of a video signal corresponding to luminance information supplied from a signal supply source (not illustrated) to the subpixel 100 selected via a signal line 111A. The scanning line drive circuit 112 includes a shift register or the like that sequentially shifts (transfers) a start pulse in synchronization with an input clock pulse. The scanning line drive circuit 112 scans the subpixels 100 row by row at the time of writing the video signal to each subpixel, and sequentially supplies the scanning signal to each scanning line 112A.

The display device 10 may be a microdisplay. The display device 10 may be included in a virtual reality (VR) device, a mixed reality (MR) device, an augmented reality (AR) device, an electronic view finder (EVF), a small projector, or the like.

Figure 2:
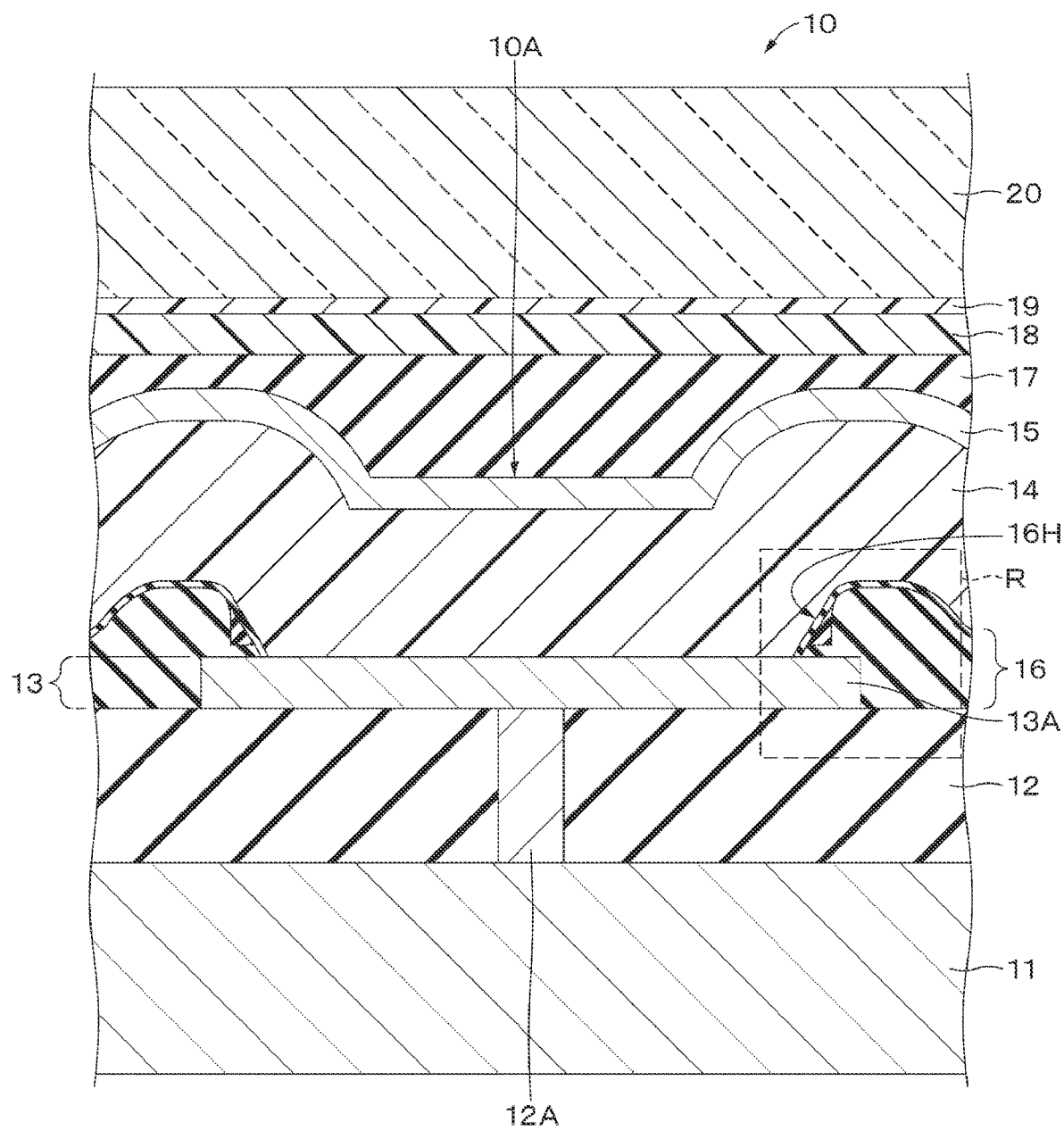
FIG. 2 is a cross-sectional view illustrating an example of a configuration of the display device according to an embodiment of the present disclosure.

FIG. 2 is a cross-sectional view illustrating an example of a configuration of the display device 10 according to an embodiment of the present disclosure. The display device 10 includes a drive substrate 11, an interlayer insulating layer 12, a first electrode layer 13, an organic electroluminescence layer 14 (hereinafter, referred to as an "EL layer 14"), a second electrode layer 15, an inter-element insulating layer 16, a protective layer 17, a color filter 18, a filling resin layer 19, and a counter substrate 20.

The display device 10 is an example of a light emitting device. The display device 10 is a top emission type display device. The counter substrate 20 side of the display device 10 is the top side, and the drive substrate 11 side of the display device 10 is the bottom side. In the following description, in each layer constituting the display device 10, a surface on the top side of the display device 10 is referred to as a first surface, and a surface on the bottom side of the display device 10 is referred to as a second surface.

The display device 10 includes a plurality of light emitting elements 10A. The plurality of light emitting elements 10A includes a first electrode layer 13, an EL layer 14, and a second electrode layer 15. The light emitting element 10A is a white light emitting element such as a white OLED or a white Micro-OLED (MOLED). As a coloring method in the display device 10, a method using a white light emitting element and a color filter 18 is used. However, the coloring method is not limited thereto, and a method for extracting three-color light (red light, green light, and blue light) by a resonator structure may be used. The color purity may be increased by using the color filter 18 and the resonator structure in combination.

(Drive Substrate)

The drive substrate 11 is a so-called backplane, and drives the plurality of light emitting elements 10A. On the first surface of the drive substrate 11, a drive circuit that drives the plurality of light emitting elements 10A, a power supply circuit that supplies power to the plurality of light emitting elements 10A, and the like (all not illustrated) are provided.

The substrate body of the drive substrate 11 may be constituted by, for example, glass or resin having low moisture and oxygen permeability, or may be constituted by a semiconductor in which a transistor or the like is easily formed. Specifically, the substrate body may be a glass substrate, a semiconductor substrate, a resin substrate, or the like. The glass substrate includes, for example, high strain point glass, soda glass, borosilicate glass, forsterite, lead glass, quartz glass, or the like. The semiconductor substrate includes, for example, amorphous silicon, polycrystalline silicon, single crystal silicon, or the like. The resin substrate contains, for example, at least one selected from the group including polymethyl methacrylate, polyvinyl alcohol, polyvinyl phenol, polyether sulfone, polyimide, polycarbonate, polyethylene terephthalate, polyethylene naphthalate, and the like.

(Interlayer Insulating Layer)

The interlayer insulating layer 12 (hereinafter, simply referred to as an "insulating layer 12") is provided on the first surface of the drive substrate 11 and covers the drive circuit, the power supply circuit, and the like. The insulating layer 12 includes a plurality of contact plugs 12A. Each contact plug 12A connects the light emitting element 10A and the drive circuit. The insulating layer 12 may further include a plurality of wires (not illustrated).

The insulating layer 12 may have a single layer structure or a laminated structure. The insulating layer 12 may be an organic insulating layer, an inorganic insulating layer, or a laminate thereof. The organic insulating layer contains, for example, at least one selected from the group including a polyimide-based resin, an acrylic resin, a novolac-based resin, and the like. The inorganic insulating layer contains, for example, at least one selected from the group including silicon oxide ($SiO_x$), silicon nitride ($SiN_x$), silicon oxynitride ($SiO_xN_y$), and the like.

(First Electrode Layer)

The first electrode layer 13 is provided on the first surface of the insulating layer 12. The first electrode layer 13 is an anode. When a voltage is applied between the first electrode layer 13 and the second electrode layer 15, holes are injected from the first electrode layer 13 into the EL layer 14. The first electrode layer 13 also functions as a reflection layer, and is preferably constituted by a material having as high a reflectance as possible and a large work function in order to enhance the light emission efficiency. The first electrode layer 13 includes a plurality of electrodes 13A. The plurality of electrodes 13A is electrically separated between the adjacent light emitting elements 10A. The plurality of electrodes 13A shares the EL layer 14. The plurality of electrodes 13A is two-dimensionally arranged in a prescribed arrangement pattern such as a matrix shape. Each of the plurality of electrodes 13A is connected to each contact plug 12A provided in the insulating layer 12. The first electrode layer 13 is connected to a drive circuit or wiring via the contact plug 12A.

The electrode 13A is constituted by at least one of a metal layer or a metal oxide layer. More specifically, the electrode 13A is constituted by a single-layer film of a metal layer or a metal oxide layer, or a laminated film of a metal layer and a metal oxide layer. In a case where the electrode 13A is constituted by a laminated film, the metal oxide layer may be provided on the EL layer 14 side, or the metal layer may be provided on the EL layer 14 side, but from the viewpoint of adjoining a layer having a high work function to the EL layer 14, the metal oxide layer is preferably provided on the EL layer 14 side.

The metal layer contains, for example, at least one metal element selected from the group including chromium (Cr), gold (Au), platinum (Pt), nickel (Ni), copper (Cu), molybdenum (Mo), titanium (Ti), tantalum (Ta), aluminum (Al), magnesium (Mg), iron (Fe), tungsten (W), and silver (Ag). The metal layer may contain at least one metal element described above as a constituent element of the alloy.

Specific examples of the alloy include an aluminum alloy and a silver alloy. Specific examples of the aluminum alloy include AlNd and AlCu.

The metal oxide layer includes, for example, a transparent conductive oxide (TCO). The transparent conductive oxide contains, for example, at least one selected from the group including a transparent conductive oxide containing indium (hereinafter, referred to as "indium-based transparent conductive oxide"), a transparent conductive oxide containing tin (hereinafter, referred to as a "tin-based transparent conductive oxide"), and a transparent conductive oxide containing zinc (hereinafter, referred to as a "zinc-based transparent conductive oxide").

The indium-based transparent conductive oxide includes, for example, indium tin oxide (ITO), indium zinc oxide (IZO), indium gallium oxide (IGO), or indium gallium zinc oxide (IGZO) fluorine-doped indium oxide (IFO). Among these transparent conductive oxides, indium tin oxide (ITO) is particularly preferable. This is because indium tin oxide (ITO) has a particularly low barrier for hole injection into the EL layer 14 as a work function, so that the drive voltage of the display device 10 can be particularly reduced. The tin-based transparent conductive oxide contains, for example, tin oxide, antimony-doped tin oxide (ATO), or fluorine-doped tin oxide (FTO). The zinc-based transparent conductive oxide includes, for example, zinc oxide, aluminum-doped zinc oxide (AZO), boron-doped zinc oxide, or gallium-doped zinc oxide (GZO).

(Second Electrode Layer)

The second electrode layer 15 is provided to face the first electrode layer 13. The second electrode layer 15 is provided as an electrode common to all the subpixels 100 in the display region 110A. The second electrode layer 15 is a cathode. When a voltage is applied between the first electrode layer 13 and the second electrode layer 15, electrons are injected from the second electrode layer 15 into the EL layer 14. The second electrode layer 15 is a transparent electrode having transparency to light generated in the EL layer 14. Here, the transparent electrode also includes a semi-transmissive reflection layer. The second electrode layer 15 is preferably constituted by a material having as high transparency as possible and a small work function in order to enhance light emission efficiency.

The second electrode layer 15 is constituted by, for example, at least one of a metal layer or a metal oxide layer. More specifically, the second electrode layer 15 is constituted by a single-layer film of a metal layer or a metal oxide layer, or a laminated film of a metal layer and a metal oxide layer. In a case where the second electrode layer 15 is constituted by a laminated film, the metal layer may be provided on the EL layer 14 side, or the metal oxide layer may be provided on the EL layer 14 side, but from the viewpoint of adjoining a layer having a low work function to the EL layer 14, the metal layer is preferably provided on the EL layer 14 side.

The metal layer contains, for example, at least one metal element selected from the group including magnesium (Mg), aluminum (Al), silver (Ag), calcium (Ca), and sodium (Na). The metal layer may contain at least one metal element described above as a constituent element of the alloy. Specific examples of the alloy include an MgAg alloy, an MgAl alloy, and an AlLi alloy. The metal oxide layer contains a transparent conductive oxide. As the transparent conductive oxide, a material similar to the transparent conductive oxide of the electrode 13A can be exemplified.

(EL Layer)

The EL layer 14 is provided between the first electrode layer 13 and the second electrode layer 15. The EL layer 14 is provided continuously over all the electrodes 13A in the display region 110A, and is shared by all the electrodes 13A in the display region 110A. The EL layer 14 is provided as an organic layer common to all the subpixels 100 in the display region 110A. The EL layer 14 is configured to emit white light.

The EL layer 14 may be an organic EL layer having a 1-stack structure, an organic EL layer having a 2-stack structure, or other organic EL layers. The organic EL layer having a 1-stack structure has a configuration in which, for example, a hole injection layer, a hole transport layer, a red light emitting layer, a light emission separation layer, a blue light emitting layer, a green light emitting layer, an electron transport layer, and an electron injection layer are laminated in this order from the first electrode layer 13 toward the second electrode layer 15. The organic EL layer having a 2-stack structure has a configuration in which, for example, a hole injection layer, a hole transport layer, a blue light emitting layer, an electron transport layer, a charge generation layer, a hole transport layer, a yellow light emitting layer, an electron transport layer, and an electron injection layer are laminated in this order from the first electrode layer 13 toward the second electrode layer 15.

The hole injection layer is for enhancing hole injection efficiency into each light emitting layer and suppressing leakage. The hole transport layer is for enhancing hole transport efficiency to each light emitting layer. The electron injection layer is for enhancing electron injection efficiency into each light emitting layer. The electron transport layer is for enhancing electron transport efficiency to each light emitting layer. The light emission separation layer is a layer for adjusting injection of carriers into each light emitting layer, and light emission balance of each color is adjusted by injecting electrons or holes into each light emitting layer via the light emitting separation layer. The charge generation layer supplies electrons and holes to two light emitting layers sandwiching the charge generation layer.

When an electric field is applied to each of the red light emitting layer, the green light emitting layer, the blue light emitting layer, and the yellow light emitting layer, recombination of holes injected from the electrode 13A and electrons injected from the second electrode layer 15 occurs, and red light, green light, blue light, and yellow light are generated.

(Inter-Element Insulating Layer)

Figure 3:
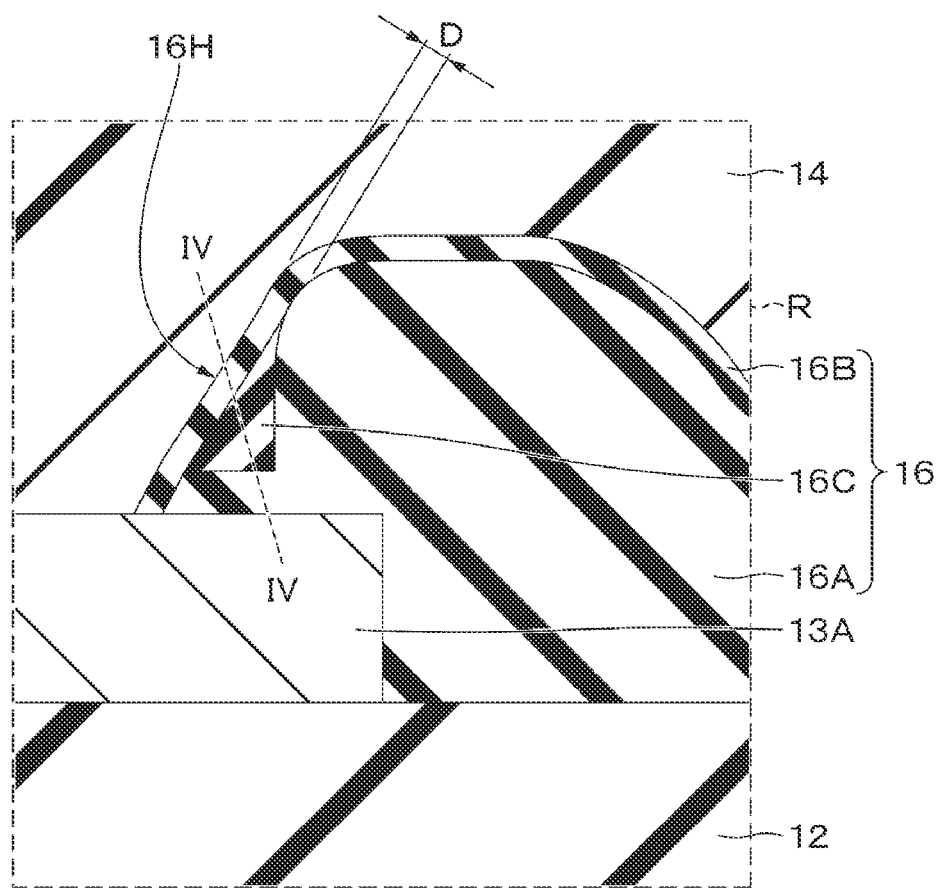
FIG. 3 is an enlarged cross-sectional view of a region R in FIG. 2.
Figure 4:
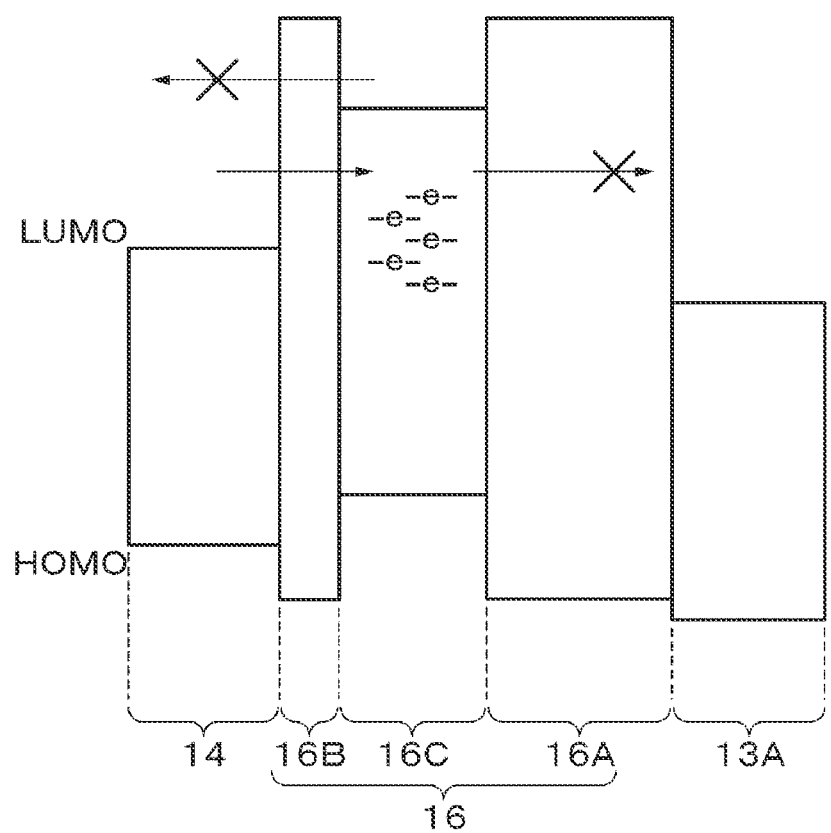
FIG. 4 is an energy diagram of each layer included in a cross section taken along line IV-IV in FIG. 3.

FIG. 3 is an enlarged cross-sectional view of a region R in FIG. 2. FIG. 4 is an energy diagram of each layer included in a cross section taken along line IV-IV in FIG. 3. The inter-element insulating layer 16 (hereinafter, simply referred to as an "insulating layer 16") is provided on the first surface of the insulating layer 12 and between adjacent first electrode layers 13, and electrically isolates the adjacent electrodes 13A from each other.

The insulating layer 16 has a plurality of openings 16H. Each of the plurality of openings 16H is provided corresponding to each subpixel 100. Each of the plurality of openings 16H is provided on the first surface of each electrode 13A (that is, the surface facing the second electrode layer 15) to expose the first surface of each electrode 13A. The first electrode layer 13 and the EL layer 14 are in contact with each other through the opening 16H. The peripheral surface of the opening 16H may be an inclined surface inclined with respect to the first surface of the electrode 13A. One opening 16H may be provided for one electrode 13A, or two or more openings 16H may be provided for one electrode 13A. The insulating layer 16 covers from the peripheral edge portion of the first surface of the electrode 13A to the side surface (end surface) of the electrode 13A. In the present specification, the peripheral edge portion of the first surface refers to a region having a predetermined width from the peripheral edge of the first surface toward the inside.

The insulating layer 16 includes an insulating layer body 16A, a barrier layer 16B, and a plurality of localized portions 16C. The insulating layer 16 forms a potential barrier between the EL layer 14 and the localized portion 16C. As a result, it is possible to suppress the carriers trapped in the localized portion 16C from being detrapped from the localized portion 16C to the EL layer 14. Therefore, reversible luminance variation can be suppressed. Note that, in the present embodiment, a case where the carrier is an electron will be described. The potential barrier formed between the EL layer 14 and the localized portion 16C is configured such that carriers can tunnel from the EL layer 14 to the localized portion 16C when a voltage is applied between the first electrode layer 13 and the second electrode layer 15.

The insulating layer 16 preferably forms a potential barrier around the localized portion 16C. That is, the localized portion 16C preferably forms a well type potential in the insulating layer 16. In this case, it is possible to suppress the carriers trapped in the localized portion 16C from being detrapped from the localized portion 16C to the surrounding members such as the EL layer 14 and the electrode 13A.

(Barrier Layer)

The barrier layer 16B is provided between the insulating layer body 16A and the EL layer 14 and between the localized portion 16C and the EL layer 14. The barrier layer 16B forms a potential barrier between the EL layer 14 and the localized portion 16C. The lower limit value of the height of the potential barrier with respect to the localized portion 16C (that is, the energy barrier difference between the localized portion 16C and the barrier layer 16B) is preferably 1 eV or more. The upper limit value of the height of the potential barrier with respect to the localized portion 16C (that is, the energy barrier difference between the localized portion 16C and the barrier layer 16B) is, for example, 5 eV or less. The height of the potential barrier with respect to the EL layer 14 (that is, the energy barrier difference between the EL layer 14 and the barrier layer 16B) is preferably 1 eV or less. When the height of the potential barrier with respect to the localized portion 16C is 1 eV or more, carriers trapped in the localized portion 16C can be suppressed from being detrapped from the localized portion 16C to the EL layer 14. When the height of the potential barrier with respect to the EL layer 14 is 1 eV or less, it is possible to suppress a decrease in the number of carriers trapped in the localized portion 16C from the EL layer 14 via the potential barrier.

The height of the potential barrier with respect to the localized portion 16C and the height of the potential barrier with respect to the EL layer 14 are obtained as follows. It can be obtained by using photoelectron spectroscopy or inverse photoelectron spectroscopy for a laminated structure including the EL layer 14, the insulating layer body 16A, the barrier layer 16B, the localized portion 16C, and the like.

The barrier layer 16B may be constituted by the same material as the insulating layer body 16A, or may be constituted by a material different from the insulating layer body 16A. The barrier layer 16B includes, for example, silicon oxide ($SiO_x$).

The average thickness of the barrier layer 16B (that is, the average distance between the EL layer 14 and the localized portion 16C) is preferably 2 nm or more and 5 nm or less. When the average thickness of the barrier layer 16B is 2 nm or more, carriers trapped in the localized portion 16C can be suppressed from being detrapped from the localized portion 16C to the EL layer 14. On the other hand, when the average thickness of the barrier layer 16B is 5 nm or less, it is possible to suppress a decrease in the number of carriers trapped in the localized portion 16C from the EL layer 14 via the potential barrier.

The average thickness of the barrier layer 16B (that is, the average distance between the EL layer 14 and the localized portion 16C) is determined as follows. First, a cross section of the display device 10 (a cross section parallel to the thickness direction of the display device 10) is cut out by cryo-focused ion beam (FIB) processing or the like to prepare a thin piece. Subsequently, the prepared thin piece is observed with a transmission electron microscope (TEM) to acquire one cross-sectional TEM image. At this time, the acceleration voltage is set to 80 kV. Next, in the acquired one cross-sectional TEM image, a thickness D (see FIG. 3) of a portion of the barrier layer 16B located between the EL layer 14 and the localized portion 16C is measured at 10 points or more. At this time, each measurement position is assumed to be randomly selected from portions of the barrier layer 16B located between the EL layer 14 and the localized portion 16C. Thereafter, the thicknesses of the barrier layer 16B measured at 10 or more points are simply averaged (arithmetic average) to determine the average thickness of the barrier layer 16B.

(Insulating Layer Body)

The insulating layer body 16A preferably forms a potential barrier between the localized portion 16C and the electrode 13A. Since the potential barrier is formed between the localized portion 16C and the electrode 13A, carriers can be prevented from being detrapped from the localized portion 16C to the electrode 13A. The lower limit value of the height of the potential barrier with respect to the localized portion 16C (that is, the energy barrier difference between the localized portion 16C and the insulating layer body 16A) is preferably 1 eV or more. When the height of the potential barrier is 1 eV or more, carriers trapped in the localized portion 16C can be suppressed from being detrapped from the localized portion 16C to the electrode 13A or the like. The upper limit value of the height of the potential barrier is not particularly limited, but is, for example, 5 eV or less. The barrier layer 16B includes, for example, silicon oxide ($SiO_x$). The energy barrier difference between the localized portion 16C and the insulating layer body 16A can be obtained in a similar manner to the energy barrier difference between the localized portion 16C and the barrier layer 16B.

(Localized Portion)

The localized portion 16C has a plurality of trap orders for trapping carriers in a forbidden band (band gap). The localized portion 16C traps carriers arriving from the EL layer 14 via the barrier layer 16B into a plurality of trap orders. The lowest unoccupied molecular orbital (LUMO) of the localized portion 16C may be higher than the LUMO of the EL layer 14.

Each of the plurality of localized portions 16C is provided on the first surface (that is, the surface facing the second electrode layer 15) of each electrode 13A. Each of the plurality of localized portions 16C is localized around each opening 16H of the insulating layer 16. Since carrier trapping is likely to occur in a portion around the opening 16H of the insulating layer 16, the localized portion 16C is provided around the opening 16H of the insulating layer 16, so that a leakage current can be reduced. The localized portion 16C is preferably provided adjacent to the barrier layer 16B.

The localized portion 16C may have a closed loop shape surrounding the opening 16H of the insulating layer 16, or may be intermittently and discontinuously provided so as to surround the opening 16H of the insulating layer 16. The localized portion 16C is preferably surrounded by an insulating material (for example, silicon oxide ($SiO_x$)) contained in the insulating layer 16. More specifically, the localized portion 16C is preferably adjacent to the peripheral surface of the opening 16H of the insulating layer 16 with the barrier layer 16B interposed therebetween.

The localized portion 16C is preferably separated from the first surface of the electrode 13A. As a result, carriers trapped in the localized portion 16C can be suppressed from being detrapped from the localized portion 16C to the electrode 13A. The shortest distance between the first electrode layer 13 and the localized portion 16C is preferably equal to or more than the average thickness of the barrier layer 16B from the viewpoint of suppressing the detrapping of carriers from the localized portion 16C to the electrode 13A.

The localized portion 16C includes an insulating material different from that of the barrier layer 16B. The localized portion 16C includes, for example, at least one selected from the group including silicon nitride ($SiN_x$), silicon oxynitride ($SiO_xN_y$), hafnium oxide ($HfO_x$), aluminum oxide ($AlO_x$), and tantalum oxide ($TaO_x$).

(Protective Layer)

The protective layer 17 is provided on the first surface of the second electrode layer 15 and covers the plurality of light emitting elements 10A. The protective layer 17 shields the light emitting elements 10A from the outside air, and suppresses moisture ingress into the light emitting elements 10A from the external environment. Furthermore, in a case where the second electrode layer 15 is constituted by a metal layer, the protective layer 17 may have a function of suppressing oxidation of the metal layer.

The protective layer 17 is constituted by, for example, an inorganic material having low hygroscopicity. The inorganic material includes, for example, at least one of silicon oxide (SiO), silicon nitride (SiN), silicon oxynitride (SiNO), titanium oxide (TiO), or aluminum oxide (AlO). The protective layer 17 may have a single layer structure, but may have a multilayer structure in a case where the thickness of the protective layer 17 is increased. This is to alleviate the internal stress in the protective layer 17. The protective layer 17 may be constituted by a polymer resin. The polymer resin contains at least one selected from the group including a thermosetting resin, an ultraviolet curable resin, and the like.

(Color Filter)

The color filter 18 is provided on the first surface of the protective layer 17. The color filter 18 is, for example, an on-chip color filter (OCCF). The color filter 18 includes, for example, a red filter, a green filter, and a blue filter. Each of the red filter, the green filter, and the blue filter is provided to face the light emitting element 10A. The red filter and the light emitting element 10A constitute a subpixel 100R, the green filter and the light emitting element 10A constitute a subpixel 100G, and the blue filter and the light emitting element 10A constitute a subpixel 100B.

White light emitted from each of the light emitting elements 10A in the subpixels 100R, 100G, and 100B passes through the red filter, the green filter, and the blue filter described above, so that red light, green light, and blue light are emitted from the display surface. Furthermore, a light shielding layer (not illustrated) may be provided between color filters of each color, that is, in a region between subpixels. Note that the color filter 18 is not limited to the on-chip color filter, and may be provided on one main surface of the counter substrate 20.

(Filling Resin Layer)

The filling resin layer 19 is provided between the color filter 18 and the counter substrate 20. The filling resin layer 19 has a function as an adhesive layer for bonding the color filter 18 and the counter substrate 20. The filling resin layer 19 contains, for example, at least one selected from the group including a thermosetting resin, an ultraviolet curable resin, and the like.

(Counter Substrate)

The counter substrate 20 is provided to face the drive substrate 11. More specifically, the counter substrate 20 is provided such that the second surface of the counter substrate 20 and the first surface of the drive substrate 11 face each other. The counter substrate 20 and the filling resin layer 19 seal the light emitting elements 10A, the color filter 18, and the like. The counter substrate 20 is constituted by a material such as glass transparent to each color light emitted from the color filter 18.

[Method for Manufacturing Display Device]

Hereinafter, an example of a method for manufacturing the display device 10 according to an embodiment of the present disclosure will be described with reference to FIGS. 5A to 5C, 6A, and 6B.

First, a drive circuit, a power supply circuit, and the like are formed on the first surface of the substrate body using, for example, a thin film forming technique, a photolithography technique, and an etching technique. As a result, the drive substrate 11 is obtained. Next, the insulating layer 12 is formed on the first surface of the drive substrate 11 so as to cover the drive circuit, the power supply circuit, and the like by, for example, a chemical vapor deposition (CVD) method. At this time, a plurality of contact plugs 12A, a plurality of wirings, and the like are formed in the insulating layer 12.

Next, a metal layer and a metal oxide layer are sequentially formed on the first surface of the insulating layer 12 by, for example, a sputtering method, and then the metal layer and the metal oxide layer are patterned using, for example, a photolithography technique and an etching technique. As a result, the first electrode layer 13 having the plurality of electrodes 13A is formed.

Figure 5:
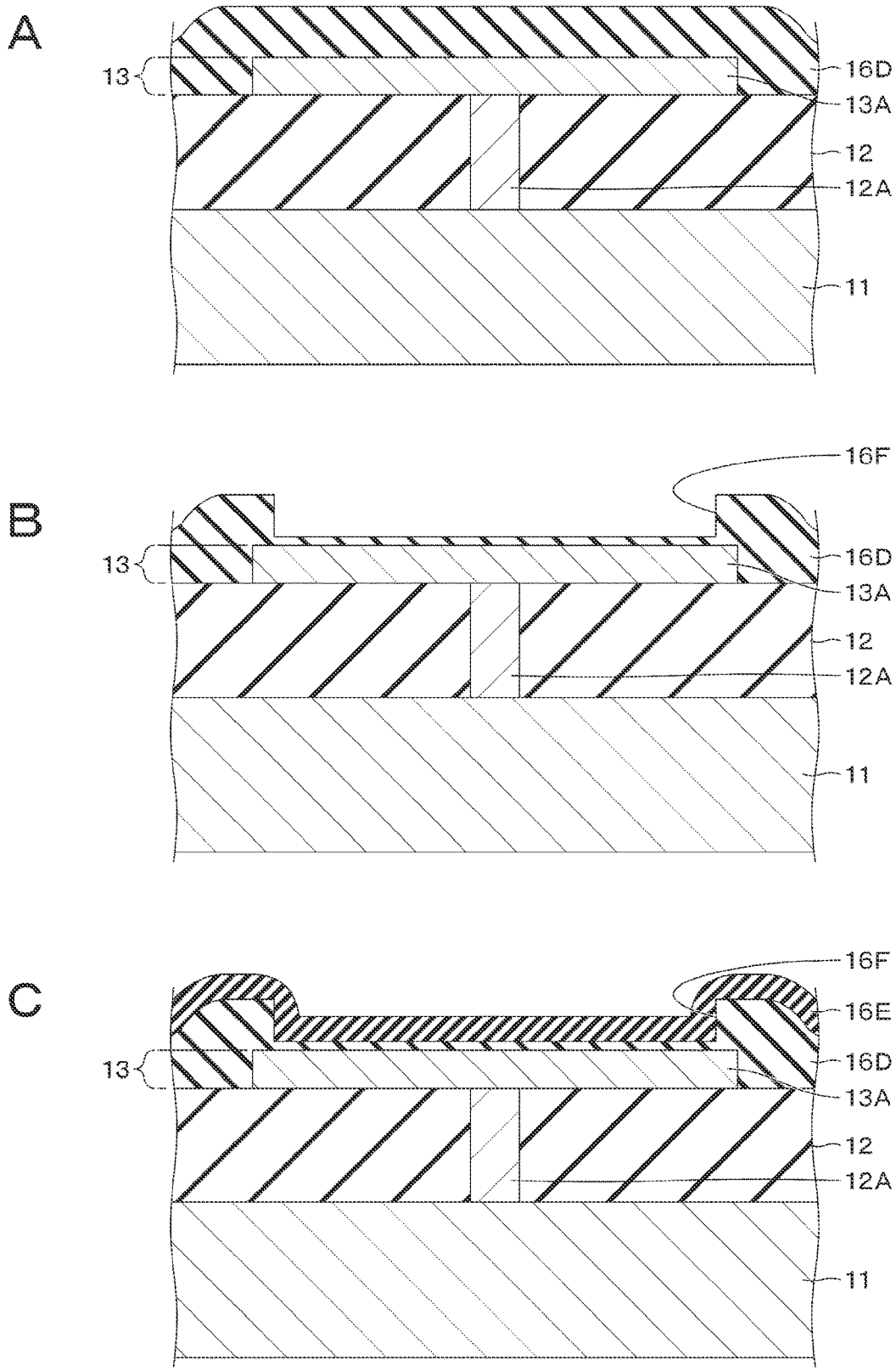
FIGS. 5A, 5B, and 5C are cross-sectional views for explaining an example of a method for manufacturing the display device according to an embodiment of the present disclosure.

Next, as illustrated in FIG. 5A, an insulating layer 16D is formed on the first surface of the insulating layer 12 so as to cover the plurality of electrodes 13A by, for example, a plasma CVD method. Next, as illustrated in FIG. 5B, a recess 16F is formed in a portion of the insulating layer 16D located on the first surface of each electrode 13A by, for example, a photolithography technique and a dry etching technique. At this time, the formation position of each recess 16F is adjusted such that the recess 16F is located inside the peripheral edge of the first surface of the electrode 13A.

Figure 6:
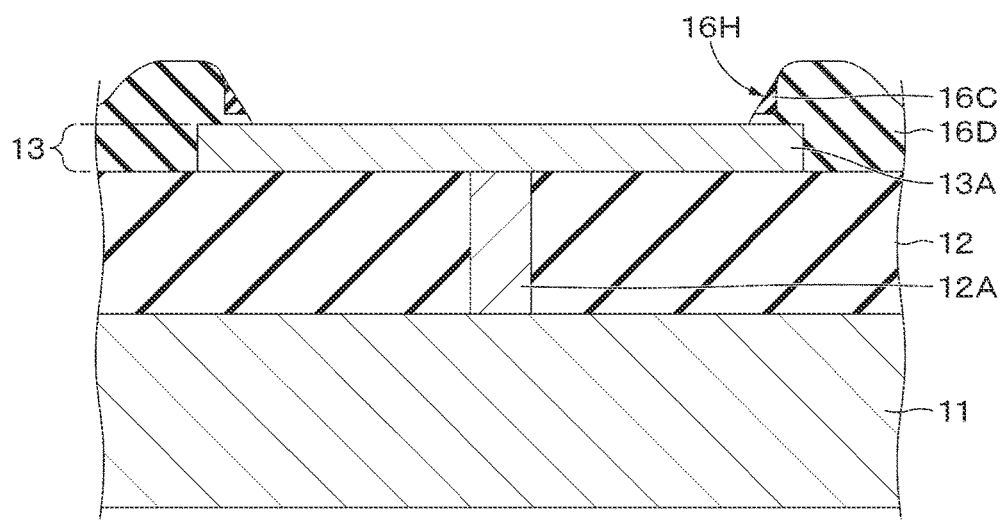
FIGS. 6A and 6B are cross-sectional views for explaining an example of a method for manufacturing the display device according to an embodiment of the present disclosure.
Figure 6:
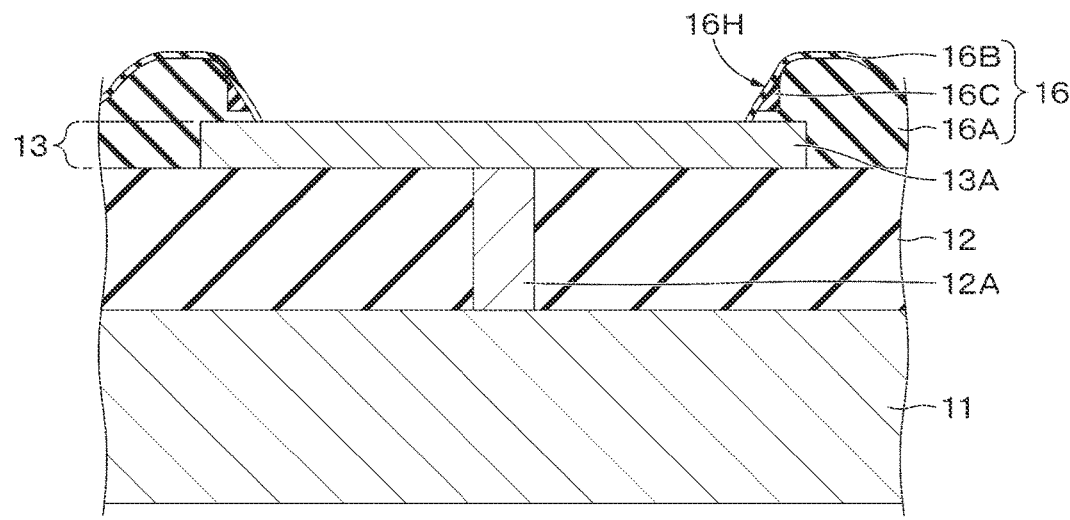

Next, as illustrated in FIG. 5C, an insulating layer 16E is formed on the first surface of the insulating layer 16D by, for example, a plasma CVD method so as to follow each recess 16F. Next, as illustrated in FIG. 6A, openings 16H are formed on the first surfaces of the plurality of electrodes 13A by, for example, etch-back. At this time, a part of the insulating layer 16E remains on the peripheral surface (inclined surface) of the opening 16H, and the localized portion 16C is formed by this residue. Next, as illustrated in FIG. 6B, the insulating layer 16D and the localized portion 16C are surface-treated by, for example, plasma treatment to form the barrier layer 16B. As a result, the insulating layer 16 is obtained.

Next, the hole injection layer, the hole transport layer, the red light emitting layer, the light emission separation layer, the blue light emitting layer, the green light emitting layer, the electron transport layer, and the electron injection layer are laminated in this order on the first surface of the electrode 13A and the first surface of the insulating layer 16 by, for example, a vapor deposition method, thereby forming the EL layer 14. Next, the second electrode layer 15 is formed on the first surface of the EL layer 14 by, for example, a vapor deposition method or a sputtering method. As a result, a plurality of light emitting elements 10A is formed on the first surface of the insulating layer 12.

Next, the protective layer 17 is formed on the first surface of the second electrode layer 15 by, for example, a CVD method or a vapor deposition method, and then the color filter 18 is formed on the first surface of the protective layer 17 by, for example, photolithography. Note that, in order to flatten the step difference of the protective layer 17 and the step difference due to the film thickness difference of the color filter 18 itself, a flattening layer may be formed on, under, or both the upper and lower sides of the color filter 18. Next, the color filter 18 is covered with the filling resin layer 19 using, for example, a one drop fill (ODF) method, and then the counter substrate 20 is placed on the filling resin layer 19. Next, for example, by applying heat to the filling resin layer 19 or irradiating the filling resin layer 19 with ultraviolet rays to cure the filling resin layer 19, the drive substrate 11 and the counter substrate 20 are bonded with the filling resin layer 19 interposed therebetween. As a result, the display device 10 is sealed. As described above, the display device 10 illustrated in FIG. 2 is obtained.

[Operation and Effect]

In order to facilitate understanding of the operation and effect of the display device 10 according to an embodiment, the operation and effect of the display device 10 will be described by comparing configurations of display devices 410 and 510 according to Comparative Examples 1 and 2 with the configuration of the display device 10 according to an embodiment.

Figure 7:
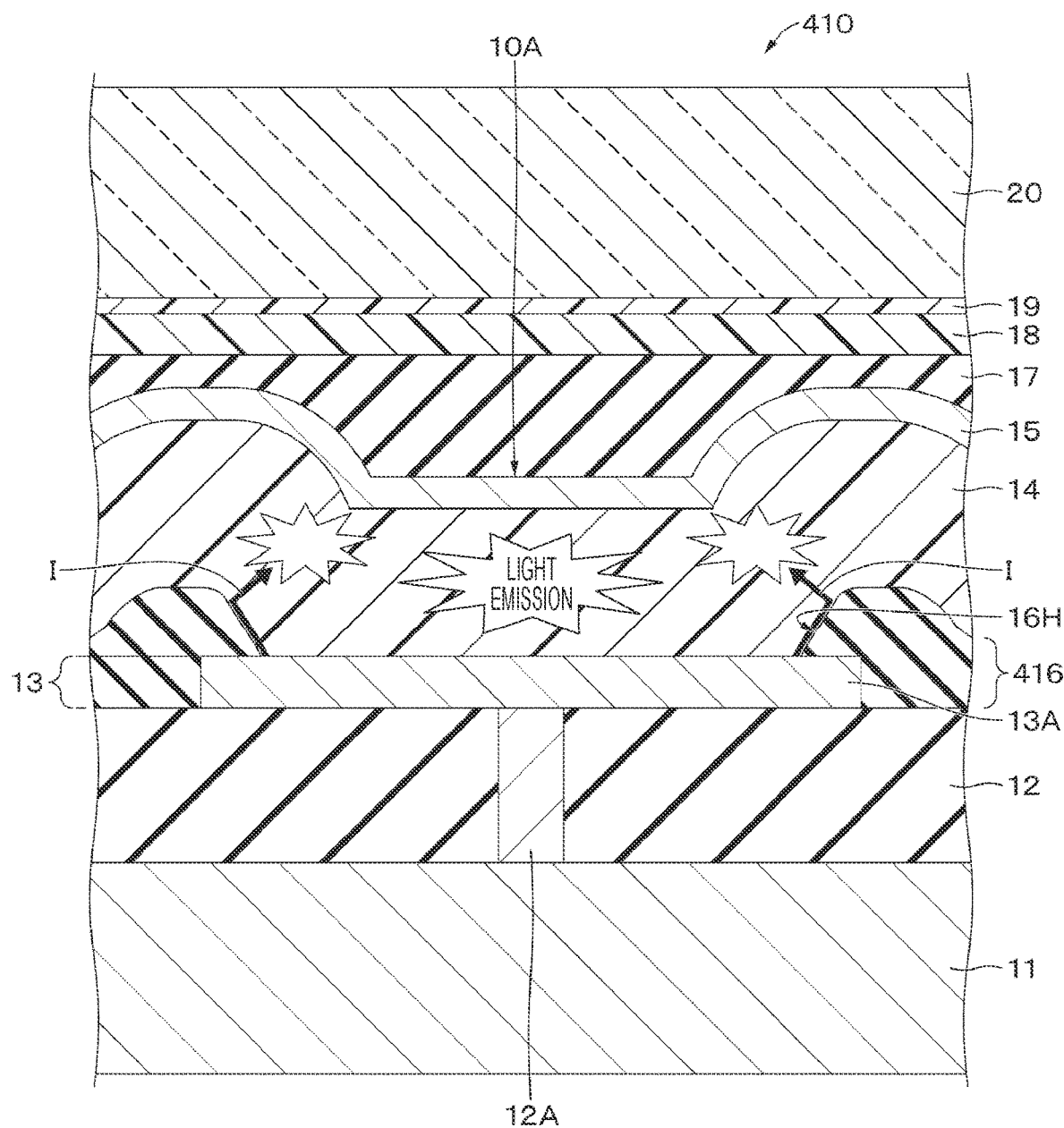
FIG. 7 is a cross-sectional view illustrating a configuration of a display device according to Comparative Example 1.

In the display device 410 according to Comparative Example 1, as illustrated in FIG. 7, the plurality of subpixels 100 shares the EL layer 14. In the display device 410 having such a configuration, in a case where the interlayer insulating layer 416 known as the interlayer insulating layer is provided, carriers flow and leak from the electrode 13A to the interface between the EL layer 14 and the interlayer insulating layer 516. When the carriers leak in this manner, abnormal light emission occurs around the opening 16H of the interlayer insulating layer 416.

Figure 8:
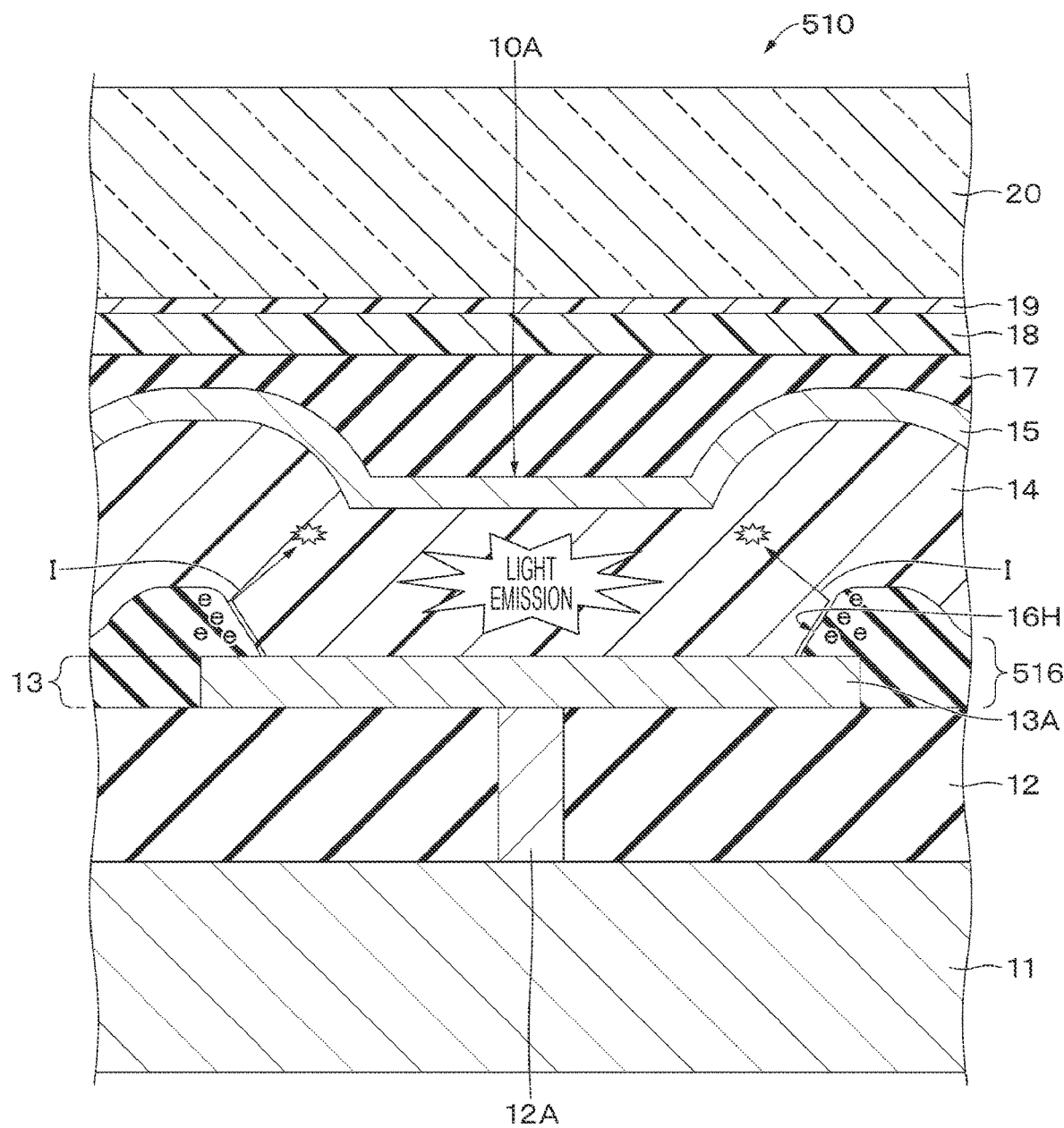
FIG. 8 is a cross-sectional view illustrating a configuration of a display device according to Comparative Example 2.

In order to suppress the occurrence of abnormal light emission described above, the present inventors have studied a display device 510 according to Comparative Example 2 in which an interlayer insulating layer 516 having many trap levels (defect orders) is provided as an interlayer insulating layer as illustrated in FIG. 8. As the interlayer insulating layer 516, for example, silicon nitride ($SiN_x$) formed by plasma CVD or the like is used. Since such an interlayer insulating layer 516 having many trap levels is provided, interface conductivity between the EL layer 14 and the interlayer insulating layer 516 is lowered, and carrier leakage is suppressed.

However, in the display device 510 according to Comparative Example 2, carriers are trapped and detrapped to the interlayer insulating layer 516. Accordingly, a phenomenon in which the leakage current reversibly fluctuates according to the trapped charge amount occurs, and as a result, reversible luminance fluctuation occurs.

As described above, in the display device 10 according to an embodiment, as illustrated in FIG. 2, the insulating layer 16 includes the localized portion 16C localized around the opening 16H of the insulating layer 16 and the barrier layer 16B provided between the EL layer 14 and the localized portion 16C. The barrier layer 16B forms a potential barrier against carriers between the EL layer 14 and the localized portion 16C. As a result, carriers once trapped from the EL layer 14 to the localized portion 16C are not easily detrapped from the localized portion 16C to the EL layer 14 and remain in the localized portion 16C. Therefore, since the reversible fluctuation of the leakage current can be suppressed, the reversible luminance fluctuation can be suppressed.

2 Modification (Modification 1)

Figure 9:
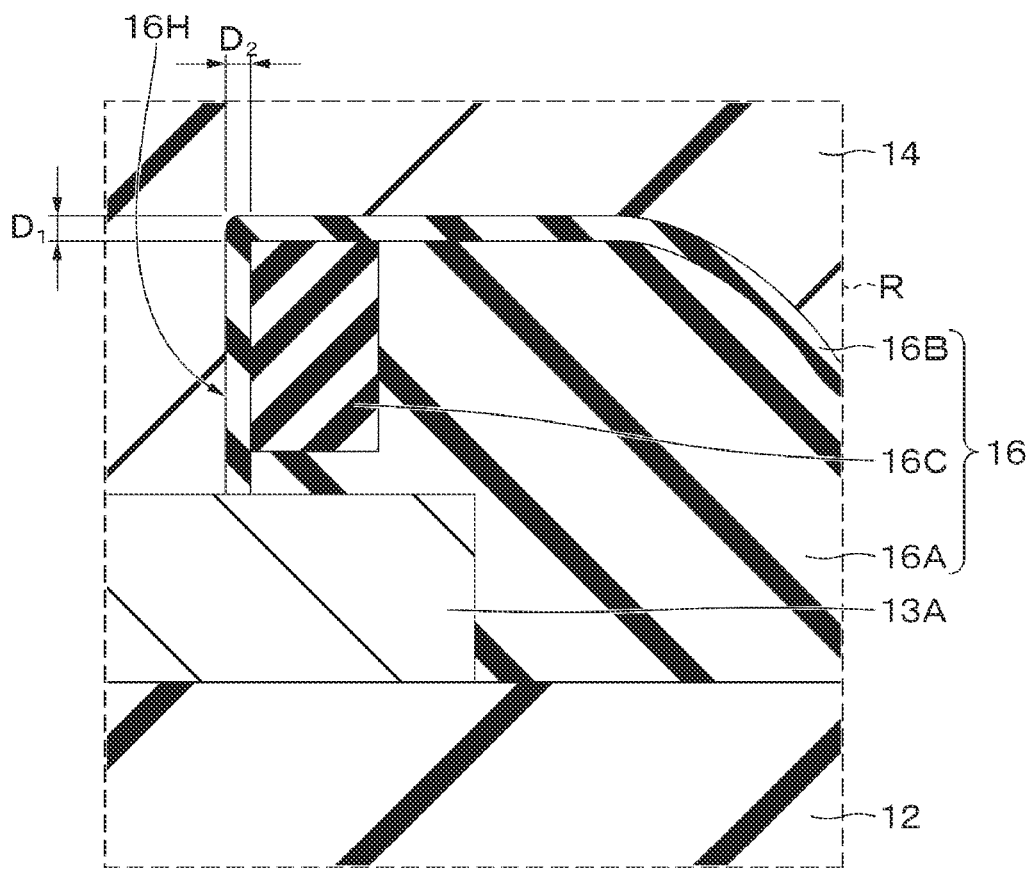
FIG. 9 is a cross-sectional view illustrating an example of a configuration of a display device according to Modification 1 of an embodiment of the present disclosure.

In the above-described embodiment, an example in which the peripheral surface of the opening 16H of the insulating layer 16 is an inclined surface has been described, but the peripheral surface of the opening 16H of the insulating layer 16 may be a vertical surface substantially perpendicular to the first surface of the electrode 13A as illustrated in FIG. 9. In this case, the localized portion 16C may be adjacent to both the peripheral surface of the opening 16H of the insulating layer 16 and the first surface (upper surface) of the insulating layer 16 with the barrier layer 16B interposed therebetween. The first surface of the insulating layer 16 is a surface on the top side of the display device 10 as described above, and is also a facing surface facing the second electrode layer 15.

Figure 10:
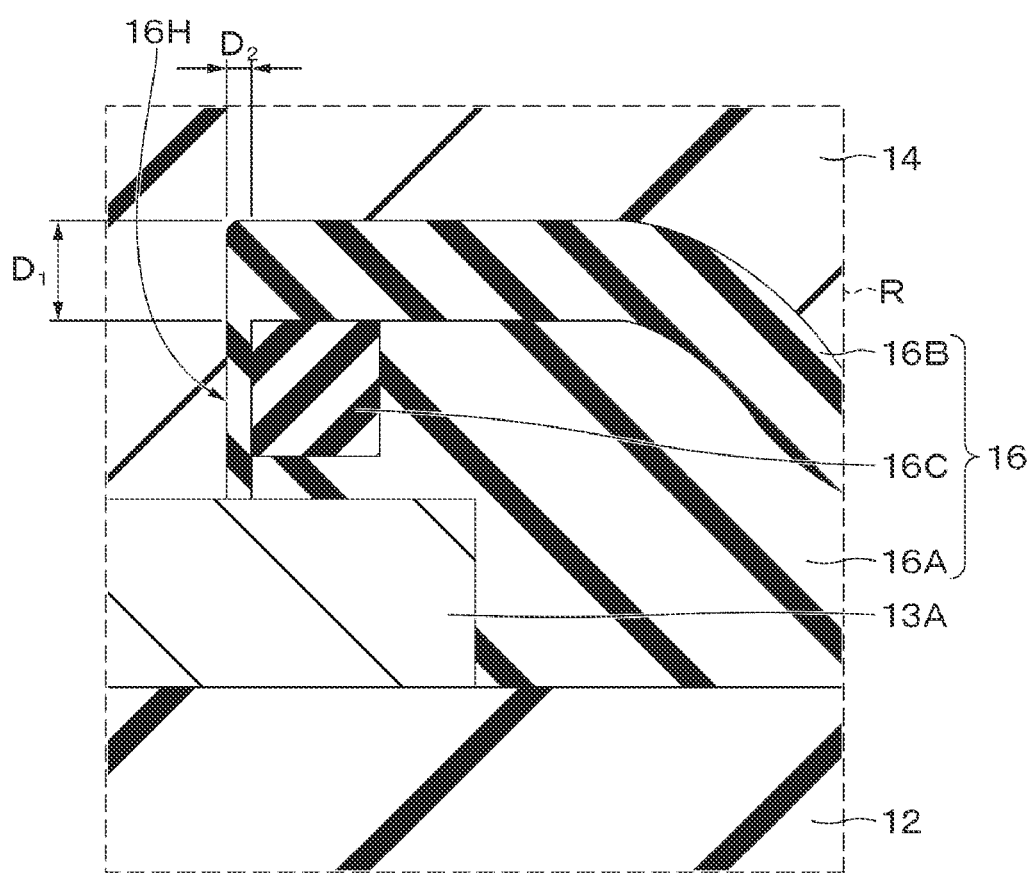
FIG. 10 is a cross-sectional view illustrating an example of a configuration of a display device according to Modification 1 of an embodiment of the present disclosure.

As illustrated in FIG. 9, the thickness $D_1$ of the barrier layer 16B on the first surface (upper surface) of the insulating layer 16 and the thickness $D_2$ of the barrier layer 16B on the peripheral surface of the opening 16H of the insulating layer 16 may be substantially constant, or as illustrated in FIG. 10, the thickness $D_1$ of the barrier layer 16B on the first surface (upper surface) of the insulating layer 16 may be thicker than the thickness $D_2$ of the barrier layer 16B on the peripheral surface of the opening 16H of the insulating layer 16. In a case where the thickness $D_1$ is thicker than the thickness $D_2$, carriers trapped in the localized portion 16C can be suppressed from being emitted from the first surface (upper surface) of the insulating layer 16 in the direction of the second electrode layer 15 (upward in FIG. 10).

Note that, also in the above-described embodiment, the thickness $D_1$ and the thickness $D_2$ may be substantially the same, or the thickness $D_1$ may be thicker than the thickness $D_2$.

(Modification 2)

Figure 11:
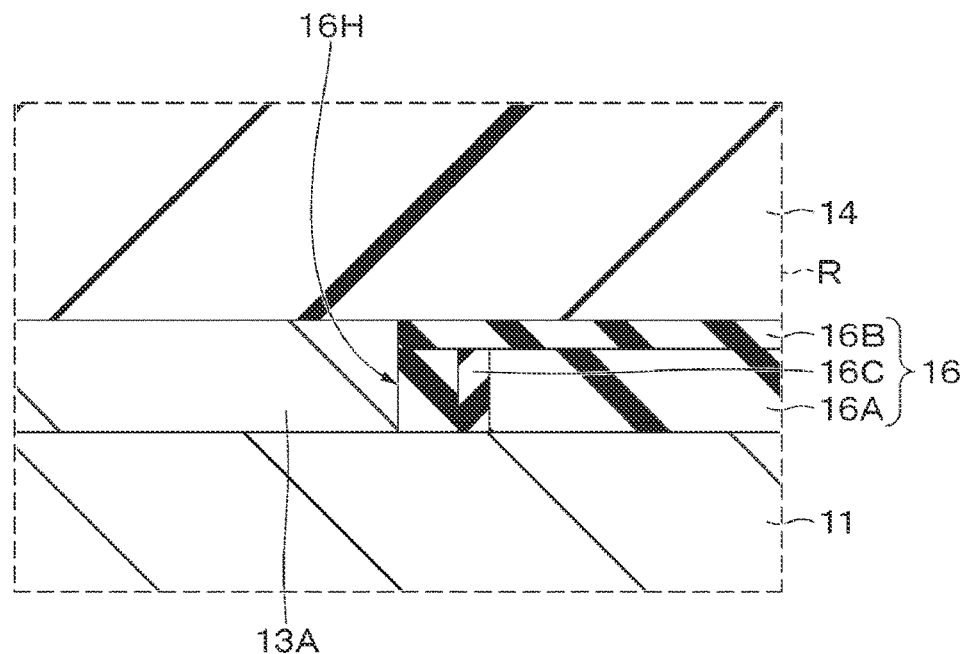
FIG. 11 is a cross-sectional view illustrating an example of a configuration of a display device according to Modification 2 of an embodiment of the present disclosure.

In the above-described embodiment, as illustrated in FIG. 3, an example in which the insulating layer 16 covers the peripheral edge portion of the first surface of the electrode 13A has been described, but as illustrated in FIG. 11, the insulating layer 16 may not cover the peripheral edge portion of the first surface of the electrode 13A. That is, the entire first surface of the electrode 13A may be exposed from the insulating layer 16 through the opening 16H. The localized portion 16C may face the side surface of the electrode 13A. The localized portion 16C may be adjacent to the first surface of the insulating layer 16 with the barrier layer 16B interposed therebetween. The first surface (upper surface) of the electrode 13A and the first surface (upper surface) of the barrier layer 16B may have substantially the same height. From the viewpoint of suppressing a decrease in the number of carriers trapped in the localized portion 16C, the localized portion 16C is preferably provided within a range of 10 nm from the side surface of the electrode 13A. In this case, the entire localized portion 16C may be provided in the range described above, or a part of the localized portion 16C may be provided in the range described above.

(Modification 3)

In the above-described embodiment, an example in which the insulating layer 16 includes the insulating layer body 16A and the barrier layer 16B has been described, but the insulating layer body 16A and the barrier layer 16B may be integrated, and an interface may not be provided between the insulating layer body 16A and the barrier layer 16B.

(Modification 4)

In the above-described embodiment, an example has been described in which the insulating layer 16 includes the localized portion 16C that traps electrons as carriers, but the insulating layer 16 may include a localized portion that traps holes as carriers instead of the localized portion 16C. Alternatively, the insulating layer 16 may include a localized portion that traps holes as carriers together with the localized portion 16C. In this case, the localized portion 16C may be provided around the opening 16H of the insulating layer 16. The localized portion that traps holes has a plurality of trap orders to trap holes.

(Modification 5)

In the above-described embodiment, an example in which the localized portion 16C includes an insulating material has been described, but the localized portion 16C may include a conductive material such as metal.

3 Application Examples (Electronic Device)

Figure 12:
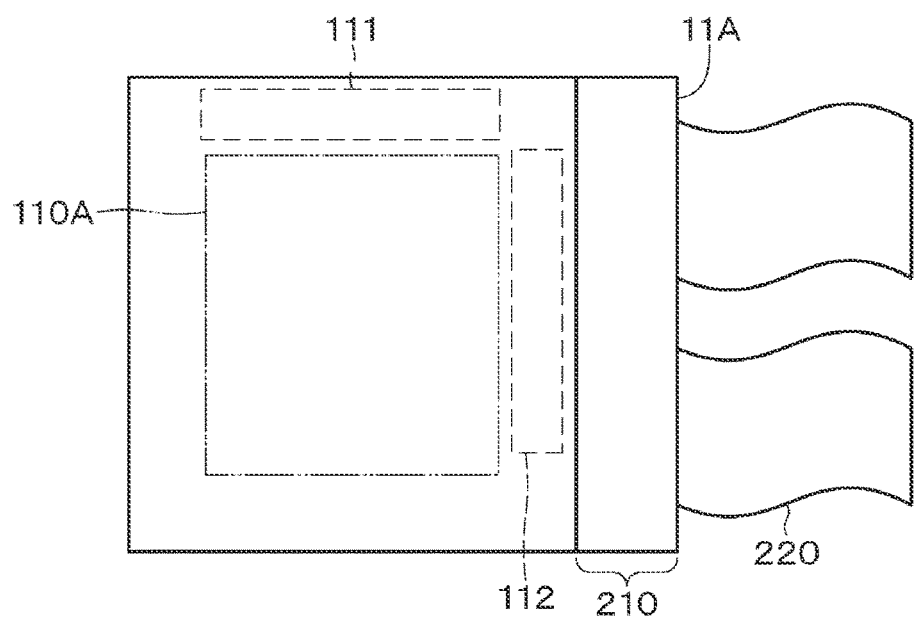
FIG. 12 is a plan view illustrating an example of a schematic configuration of a module.

The display device 10 according to the above-described embodiment and its modifications can be used for various electronic devices. The display device 10 is incorporated in various electronic devices, for example, as a module as illustrated in FIG. 12. In particular, it is suitable for electronic view finders of video cameras, single-lens reflex cameras, head-mounted displays, and the like, which require high resolution and are used in close proximity to the eyes. This module has a region 210 exposed without being covered with the counter substrate 20 or the like on one short side of the drive substrate 11, and external connection terminals (not illustrated) are formed in this region 210 by extending the wirings of the signal line drive circuit 111 and the scanning line drive circuit 112. A flexible printed circuit (FPC) 220 for inputting and outputting signals may be connected to the external connection terminals.

Specific Example 1

Figure 13:
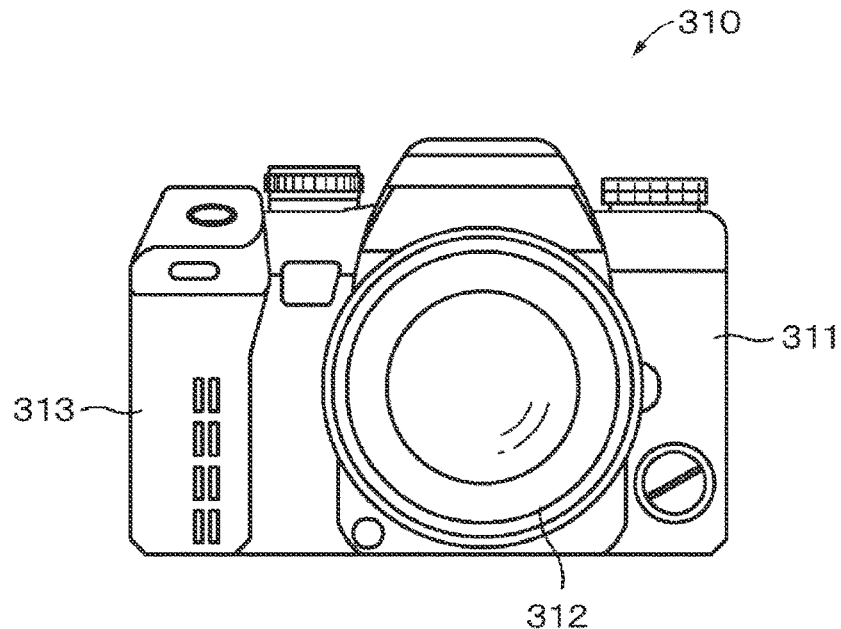
FIG. 13A is a front view illustrating an example of an external appearance of a digital still camera.
FIG. 13B is a rear view illustrating an example of an external appearance of the digital still camera.
Figure 13:
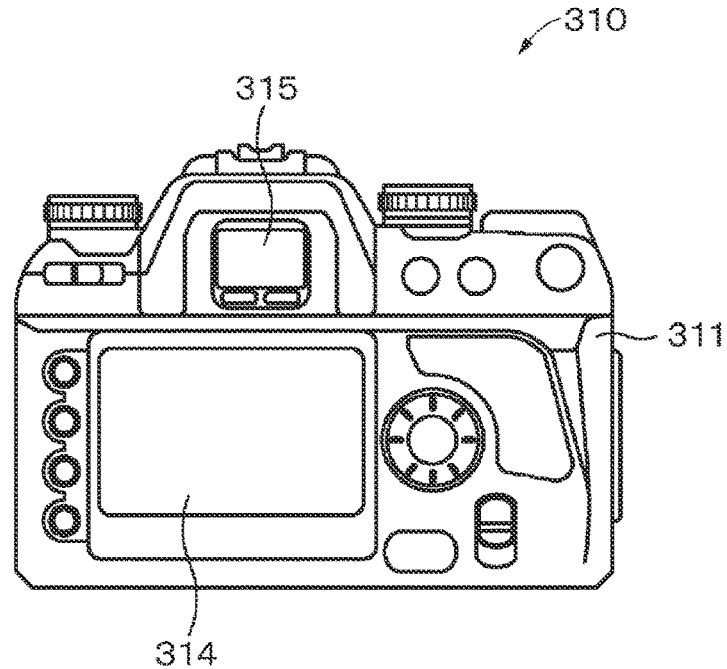

FIGS. 13A and 13B illustrate an example of an external appearance of a digital still camera 310. The digital still camera 310 is of a lens interchangeable single lens reflex type, and includes an interchangeable imaging lens unit (interchangeable lens) 312 substantially at the center in front of a camera body portion (camera body) 311, and a grip portion 313 to be held by a photographer on the front left side.

A monitor 314 is provided at a position shifted to the left from the center of the back surface of the camera body portion 311. An electronic view finder (eyepiece window) 315 is provided above the monitor 314. By looking into the electronic view finder 315, the photographer can determine the composition by visually recognizing the optical image of the subject guided from the imaging lens unit 312. As the electronic view finder 315, the display device 10 can be used.

Specific Example 2

Figure 14:
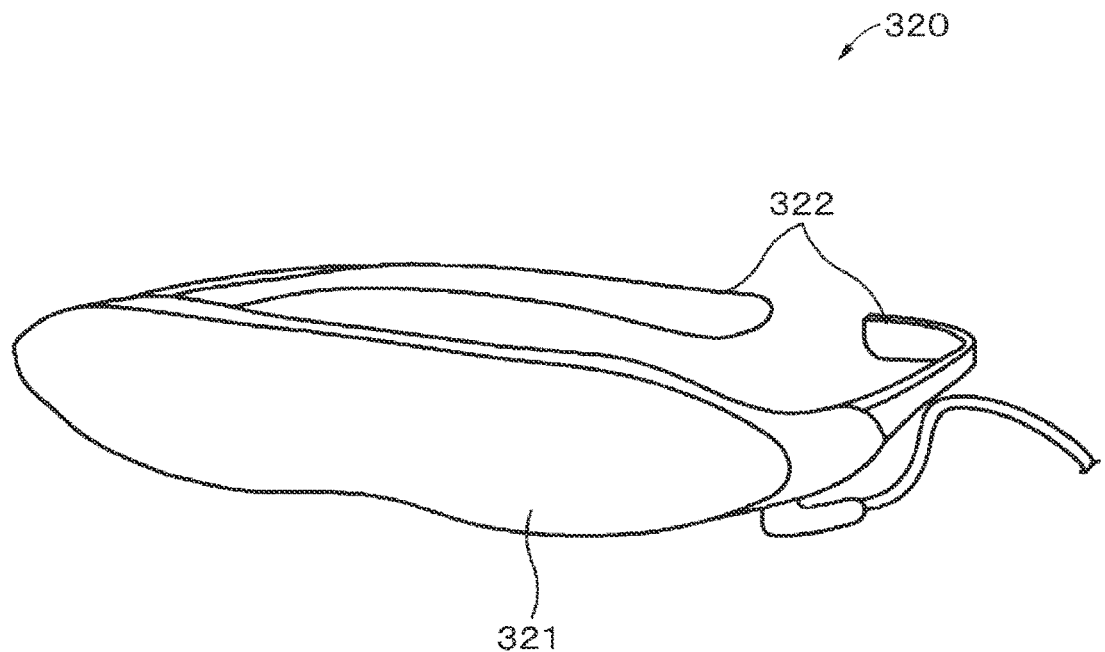
FIG. 14 is a perspective view of an example of an external appearance of a head mounted display.

FIG. 14 illustrates an example of an external appearance of a head mounted display 320. The head mounted display 320 includes, for example, ear hooking portions 322 to be worn on the head of the user on both sides of a glass-shaped display unit 321. As the display unit 321, the display device 10 can be used.

Specific Example 3

Figure 15:
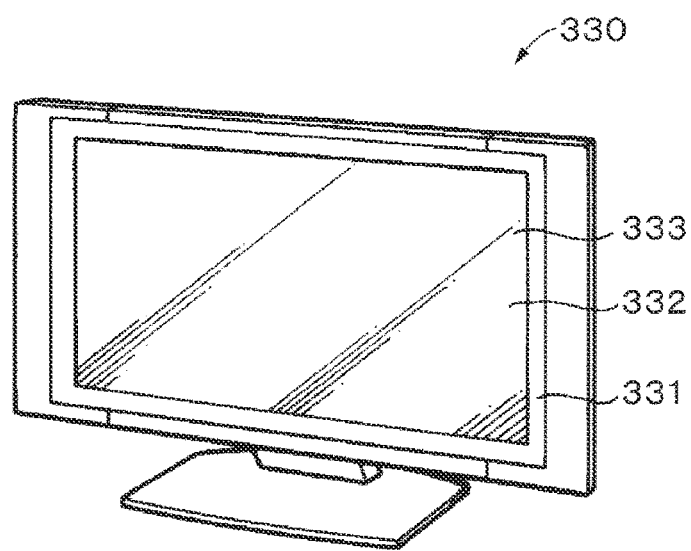
FIG. 15 is a perspective view illustrating an example of an external appearance of a television device.

FIG. 15 illustrates an example of an external appearance of a television device 330. The television device 330 includes, for example, a video display screen unit 331 including a front panel 332 and a filter glass 333, and the video display screen unit 331 includes the display device 10.

Although an embodiment of the present disclosure and the modifications thereof have been specifically described above, the present disclosure is not limited to the above-described embodiment and the modifications thereof, and various modifications based on the technical idea of the present disclosure can be made.

For example, the configurations, methods, steps, shapes, materials, numerical values, and the like described in the above-described embodiment and modifications thereof are merely examples, and different configurations, methods, steps, shapes, materials, numerical values, and the like may be used as necessary.

The configurations, methods, steps, shapes, materials, numerical values, and the like of the above-described embodiment and its modifications can be combined with each other without departing from the gist of the present disclosure.

The materials exemplified in the above-described embodiment and the modifications thereof can be used alone or in combination of two or more unless otherwise specified.

Furthermore, the present disclosure can adopt the following configurations.

(1)

A display device including:
   a first electrode layer having a plurality of electrodes arranged two-dimensionally;
   a second electrode layer provided to face the first electrode layer;
   an electroluminescence layer provided between the first electrode layer and the second electrode layer; and
   an insulating layer provided between the electrodes adjacent,
   in which the insulating layer has a plurality of openings, and each of the plurality of openings is provided corresponding to each of the electrodes,
   the insulating layer includes a plurality of localized portions, and each of the plurality of localized portions is localized around each of the openings, and
   the insulating layer forms a potential barrier between the electroluminescence layer and a localized portion.

(2)

The display device according to (1), in which the insulating layer includes an insulating material, and
   the localized portion is surrounded by the insulating material.

(3)

The display device according to (2), in which the insulating layer forms the potential barrier around the localized portion.

(4)

The display device according to (2) or (3), in which the localized portion includes at least one selected from a group including silicon nitride, silicon oxynitride, hafnium oxide, aluminum oxide, and tantalum oxide, and the insulating material contains silicon oxide.

(5)

The display device according to any one of (1) to (4), in which the insulating layer includes:

an insulating layer body; and a barrier layer provided between the insulating layer body and the electroluminescence layer, the localized portion is provided adjacent to the barrier layer, and the barrier layer forms the potential barrier.

(6)

The display device according to any one of (5), in which the electrode has a facing surface facing the second electrode layer, and the localized portion is provided on the facing surface.

(7)

The display device according to (6), in which the insulating layer has a facing surface facing the second electrode layer, and a thickness of the barrier layer on the facing surface is thicker than a thickness of the barrier layer on a peripheral surface of the opening.

(8)

The display device according to any one of (1) to (5), in which the localized portion faces a side surface of the electrode.

(9)

The display device according to any one of (1) to (8), in which a height of the potential barrier with respect to the localized portion is 1 eV or more and 5 eV or less, and a height of the potential barrier with respect to the electroluminescence layer is 1 eV or less.

(10)

The display device according to any one of (1) to (9), in which an average distance between the electroluminescence layer and the localized portion is 2 nm or more and 5 nm or less.

(11)

The display device according to any one of (1) to (10), in which the electroluminescence layer is continuously provided over the plurality of electrodes.

(12)

The display device according to any one of (1) to (11), in which the localized portion has a trap order for trapping a carrier.

(13)

The display device according to (12), in which the carrier is an electron.

(14)

An electronic device including the display device according to any one of (1) to (13).

REFERENCE SIGNS LIST

10, 410, 510 Display device
10A Light emitting element
11 Drive substrate
12 Interlayer insulating layer
13 First electrode layer
13A Electrode
14 Organic electroluminescence layer
15 Second electrode layer
16, 416, 516 Inter-element insulating layer
16A Insulating layer body
16B Barrier layer
16C Localized portion
16D, 16E Insulating layer
16F Recess
16H Opening
17 Protective layer
18 Color filter
19 Filling resin layer
20 Counter substrate
100R, 100G, 100B Subpixel
110A Display region
110B Peripheral region
111 Signal line drive circuit
111A Signal line
112 Scanning line drive circuit
112A Scanning line
310 Digital still camera (electronic device)
320 Head mounted display (electronic device)
330 Television device (electronic device)

The invention claimed is:

1. A display device comprising:
a first electrode layer having a plurality of electrodes arranged two-dimensionally;
a second electrode layer provided to face the first electrode layer;
an electroluminescence layer provided between the first electrode layer and the second electrode layer; and
an insulating layer provided between the electrodes adjacent,
wherein the insulating layer has a plurality of openings, and each of the plurality of openings is provided corresponding to each of the electrodes,
the insulating layer includes a plurality of localized portions, and each of the plurality of localized portions is localized around each of the openings, and
the insulating layer forms a potential barrier between the electroluminescence layer and a localized portion.

2. The display device according to claim 1, wherein the insulating layer includes an insulating material, and
the localized portion is surrounded by the insulating material.

3. The display device according to claim 2, wherein the insulating layer forms the potential barrier around the localized portion.

4. The display device according to claim 2, wherein the localized portion includes at least one selected from a group including silicon nitride, silicon oxynitride, hafnium oxide, aluminum oxide, and tantalum oxide, and
the insulating material contains silicon oxide.

5. The display device according to claim 1,
wherein the insulating layer includes:
an insulating layer body; and
a barrier layer provided between the insulating layer body and the electroluminescence layer,
the localized portion is provided adjacent to the barrier layer, and
the barrier layer forms the potential barrier.

6. The display device according to claim 5, wherein the first electrode layer has a facing surface facing the second electrode layer, and
the localized portion is provided on the facing surface.

7. The display device according to claim 6, wherein the insulating layer has a facing surface facing the second electrode layer, and a thickness of the barrier layer on the facing surface is thicker than a thickness of the barrier layer on a peripheral surface of the opening.

8. The display device according to claim 1, wherein a respective localized portion faces a side surface of a respective electrode.

9. The display device according to claim 1, wherein a height of the potential barrier with respect to the localized portion is 1 eV or more and 5 eV or less, and a height of the potential barrier with respect to the electroluminescence layer is 1 eV or less.

10. The display device according to claim 1, wherein an average distance between the electroluminescence layer and the localized portion is 2 nm or more and 5 nm or less.

11. The display device according to claim 1, wherein the electroluminescence layer is continuously provided over the plurality of electrodes.

12. The display device according to claim 1, wherein the localized portion has a trap order for trapping a carrier.

13. The display device according to claim 12, wherein the carrier is an electron.

14. An electronic device comprising the display device according to claim 1.

* * * * *